United States Patent

Miya et al.

Patent Number: 5,446,419
Date of Patent: Aug. 29, 1995

[54] MICROWAVE OSCILLATION APPARATUS CAPABLE OF SUPPRESSING SPURIOUS OSCILLATION

[75] Inventors: Tatsuya Miya; Kazuyoshi Uemura, both of Tokyo, Japan

[73] Assignee: NEC Corporation, Tokyo, Japan

[21] Appl. No.: 280,852

[22] Filed: Jul. 26, 1994

[30] Foreign Application Priority Data

Jul. 27, 1993 [JP] Japan .................................. 5-204584

[51] Int. Cl.⁶ .............................................. H03B 5/18
[52] U.S. Cl. ................................. 331/99; 331/107 SL; 331/115; 331/117 FE; 331/117 D
[58] Field of Search ............... 331/96, 99, 107 SL, 331/117 R, 117 FE, 117 D, 115

[56] References Cited

U.S. PATENT DOCUMENTS 4,149,127 4/1979 Murakami et al. ............ 331/117 D
4,331,940 5/1982 Uwano ...................... 331/107 SL

FOREIGN PATENT DOCUMENTS 64-16106 1/1989 Japan .
3-140003 6/1991 Japan .

Primary Examiner—Siegfried H. Grimm
Attorney, Agent, or Firm—Popham, Haik, Schnobrich & Kaufman, Ltd.

[57] ABSTRACT

In a microwave oscillation apparatus including a negative resistance element, a microstrip line having a first end connected to the negative resistance element and a second end connected to a terminating resistor, and a dielectric resonator magnetically coupled to the microstrip line, a capacitive stub is provided on the microstrip line at a distance ($\frac{1}{4}$) $\lambda_s$ $(2N-1)$ from the first end thereof, where $\lambda_s$ is a wavelength of a spurious oscillation frequency component and N is a positive integer.

7 Claims, 5 Drawing Sheets

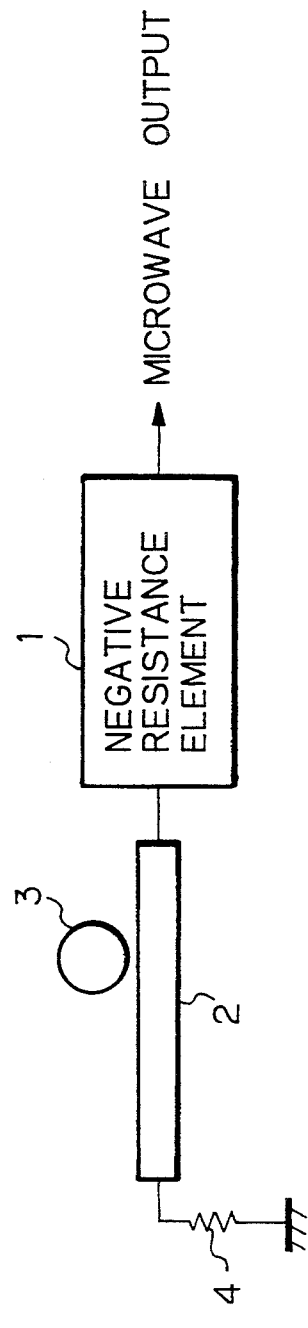
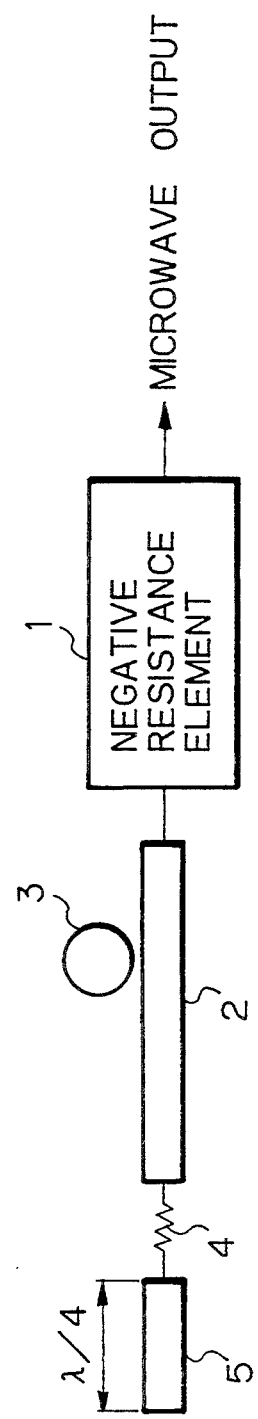

MICROWAVE OSCILLATION APPARATUS CAPABLE OF SUPPRESSING SPURIOUS OSCILLATION

BACKGROUND OF THE INVENTION

1. Field of the Invention

The present invention relates to a stable microwave oscillation apparatus.

2. Description of the Related Art

A prior art microwave oscillation apparatus is comprised of a negative resistance element, a microstrip line having an end connected to the negative resistance element and another end connected to a terminating resistor, and a dielectric resonator magnetically connected to the microstrip line, to thereby generate a microwave output having a resonance frequency $f_o$ determined by the microstrip line and the dielectric resonator. In this prior art microwave oscillation device, in order to stabilize the oscillation, the terminating resistor is connected to a quarter-wave open end for the resonance frequency $f_o$ or a spurious oscillation frequency $f_s$, and as a result, the ground impedance of the terminating resistor is made zero at the resonance oscillation frequency $f_o$ or the spurious oscillation frequency $f_s$. This will be explained later in detail.

In the above-mentioned prior art, however, the ground impedance of the terminating resistor is not zero even at a frequency slightly different from the resonance oscillation frequency $f_o$ or the spurious oscillation frequency $f_s$. Therefore, it is impossible to completely stop spurious oscillations.

SUMMARY OF THE INVENTION

It is, therefore, an object of the present invention to provide a microwave oscillation apparatus which can suppress spurious oscillations.

According to the present invention, in a microwave oscillation apparatus including a negative resistance element, a microstrip line having a first end connected to the negative resistance element and a second end connected to a terminating resistor, and a dielectric resonator magnetically coupled to the microstrip line, a capacitive stub is provided on the microstrip line at a distance $(\frac{1}{4}) \lambda_s (2N-1)$ from the first end thereof, where $\lambda_s$ is a wavelength of a spurious oscillation frequency component and N is a positive integer. That is, the capacitive stub serves to change the frequency characteristic of the negative resistance element viewed from the terminating resistor. As a result, the impedance of the terminating resistor viewed from the negative resistance element can be large enough to suppress the oscillation at spurious frequencies. In other words, the capacitive stub reduces the negative resistance value of the negative resistance element at the spurious frequencies, thus stabilizing the operation of the microwave oscillation apparatus.

BRIEF DESCRIPTION OF THE DRAWINGS

The present invention will be more clearly understood from the description as set forth below, in comparison with the prior art, with reference to the accompanying drawings, wherein:

FIG. 1 is a constitutional diagram illustrating a first prior art microwave oscillation apparatus;

FIG. 2 is a constitutional diagram illustrating a second prior art microwave oscillation apparatus;

DESCRIPTION OF THE PREFERRED EMBODIMENTS

Figure 3:
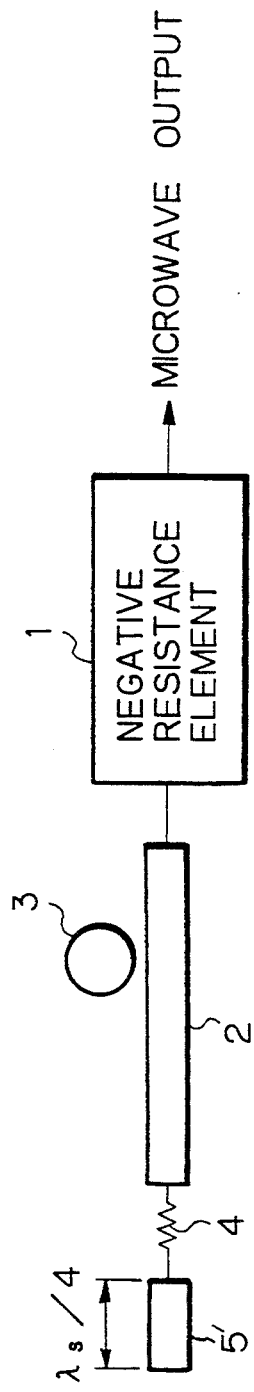
FIG. 3 is a constitutional diagram illustrating a third prior art microwave oscillation apparatus.

Before the description of the preferred embodiments, prior art microwave oscillation apparatuses will be explained with reference to FIGS. 1 through 4.

In FIG. 1, which illustrates a first prior art microwave oscillation apparatus, reference 1 designates a negative resistance element which is connected to a microstrip line 2 whose characteristic impedance $Z_o$ is, in this case, about 50Ω. A dielectric resonator 3 is located in proximity to the microstrip line 2, so that the dielectric resonator 3 is magnetically coupled to the microstrip line 2. Therefore, a resonance frequency $f_o$ is determined by the microstrip 2 and the dielectric resonator 3. In order to realize a non-reflection end at frequencies other than the resonance frequency $f_o$, a terminating resistor 4, whose resistance value is about 50Ω, is connected between the microstrip 2 and ground. Even in this case, since oscillations at spurious frequencies occur in accordance with a relative relationship between a reflection coefficient toward the negative resistance element 1, and a reflection coefficient toward the terminating resistor 4, oscillations at spurious frequencies may occur in accordance with the reflection coefficient toward the negative element 1.

Also, it is impossible to connect the terminating resistor 4 to ground in an ideal state, since the terminating resistor 4 is actually connected to ground via a printed board or the like, so that the terminating resistor 4 has a parasitic capacity.

In FIG. 2, which illustrates a second prior art microwave oscillation apparatus, an open end stub 5 having a length $\lambda/4$ where $\lambda$ is the wavelength of the resonance frequency $f_o$ is connected to the terminating resistor 4 of FIG. 1. As a result, the input impedance of the open end stub 5 is zero at frequencies $f_o/(2N-1)$ where N equals 1, 2, ...; however, the non-reflection condition is not satisfied at the end of the microstrip line 2 on the terminating resistor 4 at other frequencies. Therefore, when the reflection coefficient toward the terminating resistor 4 viewed from the negative resistance element 1, and the reflection coefficient toward the negative resistance element 1, satisfy an oscillation condition, a spurious oscillation or a mode jump may occur, to thereby destabilize the oscillation of microwaves.

In FIG. 3, which illustrates a third prior art microwave oscillation apparatus, an open end stub 5' having a length $\lambda_s/4$ where $\lambda_s$ is the wavelength of a spurious frequency $f_s$, is connected to the terminating resistor 4 of FIG. 1 (see: JP-A-64-16106). As a result, the input impedance of the open end stub 5' is zero at frequencies $f_s/(2N-1)$ where N equals 1, 2, . . . ; however, the non-reflection condition is not satisfied at the end of the microstrip line 2 on the terminating resistor 4 at other frequencies. Therefore, when the reflection coefficient toward the terminating resistor 4 viewed from the negative resistance element 1, and the reflection coefficient toward the negative resistance element 1, satisfy an oscillation condition, another spurious oscillation or a mode jump may occur, to thereby destabilize the oscillation of microwaves.

Figure 4:
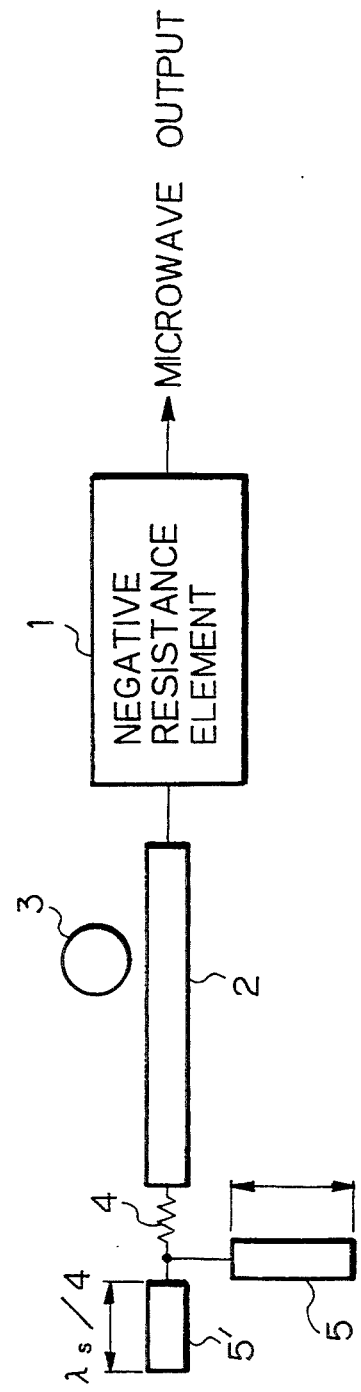
FIG. 4 is a constitutional diagram illustrating a fourth prior art microwave oscillation apparatus.

In FIG. 4, which illustrates a fourth prior art microwave oscillation apparatus, both of the open end stubs 5 and 5' are connected to the terminating resistor 4 of FIG. 1 (see: JP-A-3-140003). Even in FIG. 4, the non-reflection condition is not satisfied at the end of the microstrip line 2 on the terminating resistor 4 at frequencies other than the resonance frequency $f_o$ and the spurious frequency $f_s$. Therefore, when the reflection coefficient toward the terminating resistor 4 viewed from the negative resistance element 1, and the reflection coefficient toward the negative resistance element 1, satisfy an oscillation condition, another spurious oscillation or a mode jump may occur, to thereby destabilize the oscillation of microwaves.

Figure 5:
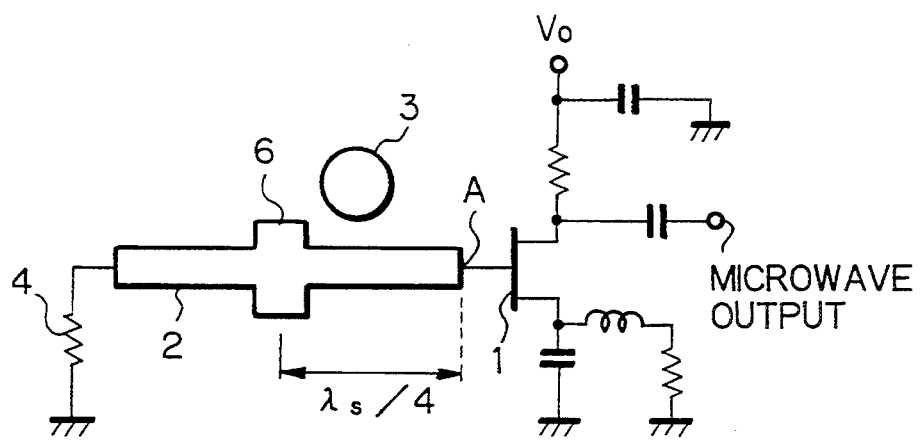
FIG. 5 is a constitutional diagram illustrating a first embodiment of the microwave oscillation apparatus according to the present invention.

In FIG. 5, which illustrates a first embodiment of the present invention, a capacitive stub 6 is provided on the microstrip line 2 at a distance $\lambda_s/4$ from the end A thereof on the side of the negative resistance element 1 of FIG. 1. Note that the distance $\lambda_s/4$ can be replaced by $(\frac{1}{4}) \lambda_s (2N-1)$ where N equals 2, 3, . . . . That is, the capacitive stub 6 serves to change the frequency characteristic of the negative resistance element 1 viewed from the terminating resistor 4. As a result, the impedance of the terminating resistor 4 viewed from the negative resistance element 1 can be large enough to suppress tile oscillation at spurious frequencies other than the resonance frequency $f_o$. In other words, the capacitive stub 6 reduces the negative resistance value of the negative resistance element 1 at the spurious frequencies, thus stabilizing the operation of the microwave oscillation apparatus.

Figure 6A:
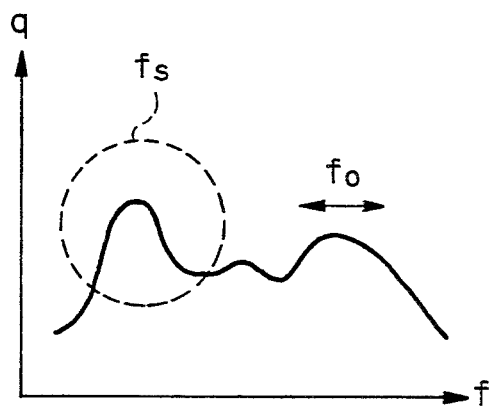
FIGS. 6A and 6B are diagrams showing reflection coefficient to frequencies characteristics.
Figure 6B:
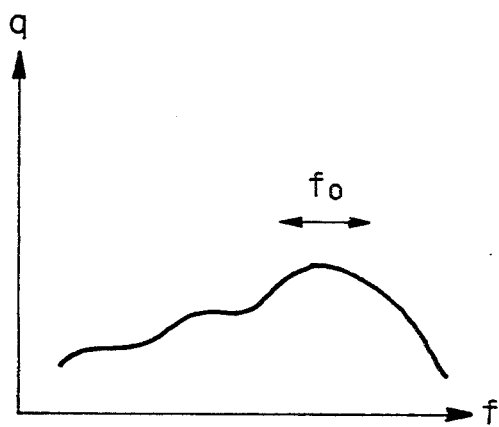

As shown in FIG. 6A which shows a reflection coefficient to frequency characteristic toward the negative resistance element 1 viewed from the terminating resistor 4 in the apparatus of FIG. 1, oscillations occur in the proximity of the spurious frequency $f_s$. Contrary to this, in the first embodiment, as shown in FIG. 6B, the negative resistance of the negative resistance element 1 is made small in the proximity of the spurious frequency $f_s$. As a result, no oscillation occurs in the proximity of the spurious frequency $f_s$.

Thus, the prior art microwave oscillation apparatuses as illustrated in FIGS. 2, 3 and 4 are intended to realize a non-reflection end without changing the impedance on the side of the negative resistance element 1 viewed from the terminating resistor 4. On the other hand, tile first embodiment is intended to shift the impedance of the negative resistance element 1 viewed from the terminating resistor 4, to suppress the spurious oscillation.

Figure 7:
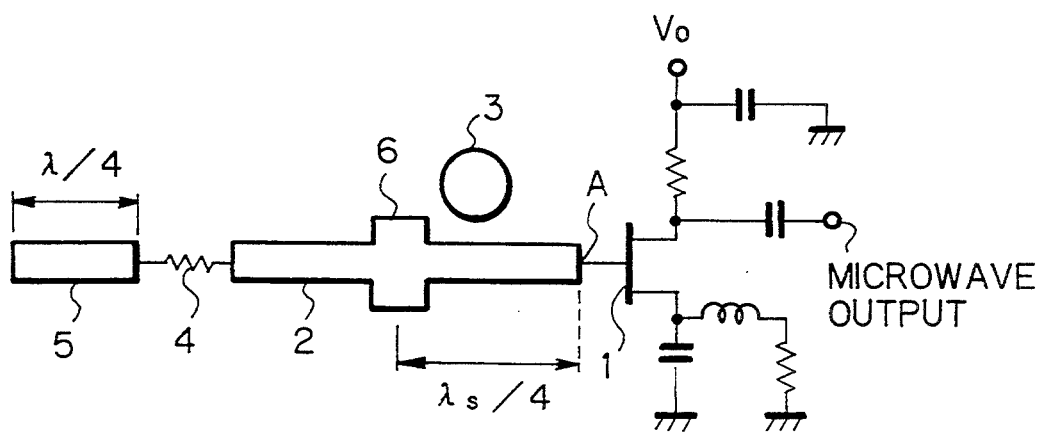
FIG. 7 is a constitutional diagram illustrating a second embodiment of the microwave oscillation apparatus according to the present invention.
Figure 8:
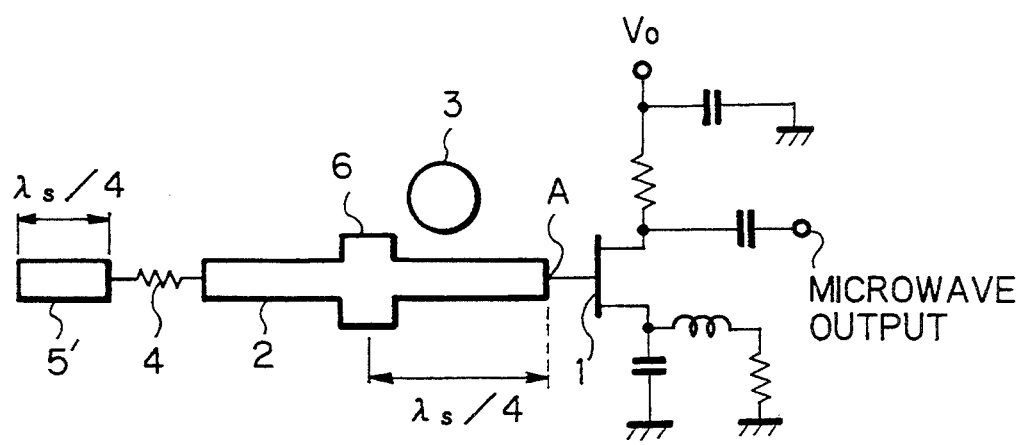
FIG. 8 is a constitutional diagram illustrating a third embodiment of the microwave oscillation apparatus according to the present invention.
Figure 9:
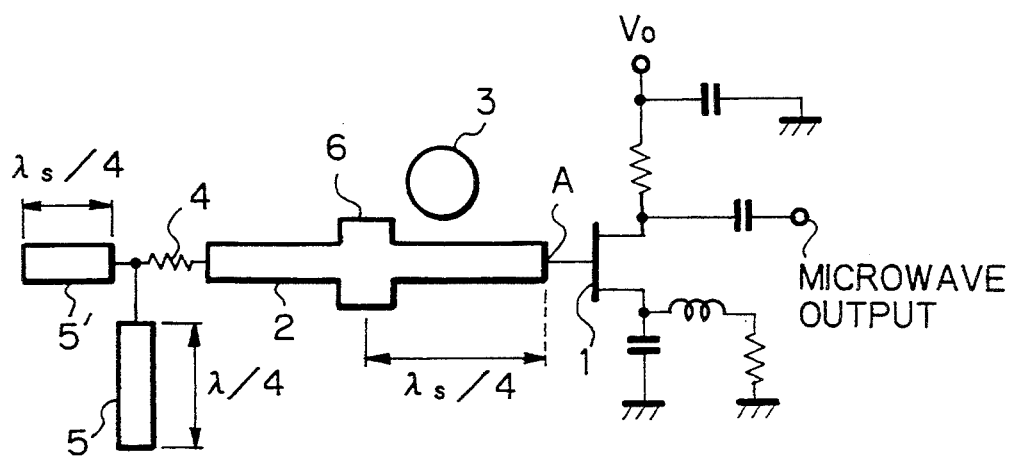
FIG. 9 is a constitutional diagram illustrating a fourth embodiment of the microwave oscillation apparatus according to the present invention.

Also, as described above, the object of the open end stubs 5 and 5' is different from that of the capacitive stub 6. Therefore, the open end stub 5 and/or the open end stub 5' are added to the elements of FIG. 5, as illustrated in FIGS. 7, 8 and 9 which illustrate second, third and fourth embodiments, respectively, of the present invention, thus further suppressing the oscillation at spurious frequencies.

In the above-described embodiments, the negative resistance element 1 is comprised of a GaAs FET, however, the negative resistance element 1 can be formed by using a bipolar transistor, a Gunn diode, or the like.

As explained hereinbefore, according to the present invention, since oscillations at spurious frequencies can be suppressed, a stable microwave oscillation apparatus can be obtained.

We claim:
1. A microwave oscillation apparatus comprising:
   a negative resistance element;
   a microstrip line having a first end connected to said negative resistance element;
   a terminating resistor connected to a second end of said microstrip line;
   a dielectric resonator magnetically coupled to said microstrip line; and
   a capacitive stub provided on said microstrip line at a distance $(\frac{1}{4}) \lambda_s (2N-1)$ from the first end of said microstrip line, where $\lambda_s$ is a wavelength of a spurious oscillation frequency component and N is a positive integer.

2. An apparatus as set forth ill claim 1, further comprising an open end stub connected to said terminating resistor, said open end stub having a length $\lambda/4$ where $\lambda$ is a wavelength of a resonance frequency determined by said microstrip line and said dielectric resonator.

3. An apparatus as set forth in claim 1, further comprising an open end stub connected to said terminating resistor, said open end stub having a length $\lambda_s/4$ where $\lambda_s$ is a wavelength of a spurious frequency.

4. An apparatus as set forth in claim 1, further comprising:
   a first open end stub connected to said terminating resistor, said first open end stub having a length $\lambda/4$ where $\lambda$ is a wavelength of a resonance frequency determined by said microstrip line and said dielectric resonator; and
   a second open end stub connected to said terminating resistor, said second open end stub having a length $\lambda_s/4$ where $\lambda_s$ is a wavelength of a spurious frequency.

5. An apparatus as set forth in claim 1, wherein said negative resistance element comprises a GaAs FET.

6. A microwave oscillation apparatus comprising:
   a negative resistance element;
   a microstrip line having a first end connected to said negative resistance element;
   a terminating resistor connected to a second end of said microstrip line;
   a dielectric resonator magnetically coupled to said microstrip line;
   a capacitive stub provided on said microstrip line at a distance $\lambda_s/4$ from the first end of said microstrip line, where $\lambda_s$ is a wavelength of a spurious oscillation frequency component; and
   an open end stub connected to said terminating resistor, said open end stub having a length $\lambda/4$ where $\lambda$ is a wavelength of a resonance frequency determined by said microstrip line and said dielectric resonator.

7. A microwave oscillation apparatus comprising:
   a negative resistance element;
   a microstrip line having a first end connected to said negative resistance element;

a terminating resistor connected to a second end of said microstrip line;

a dielectric resonator magnetically coupled to said microstrip line;

a capacitive stub provided on said microstrip line at a distance $\lambda_s/4$ from the first end of said microstrip line, where $\lambda_s$ is a wavelength of a spurious oscillation frequency component; and an open end stub connected to said terminating resistor, said open end stub having the length $\lambda_s/4$.

* * * * *